(12) United States Patent
Yeh

(10) Patent No.: US 7,002,393 B2
(45) Date of Patent: Feb. 21, 2006

(54) SWITCHED CAPACITOR CIRCUIT CAPABLE OF MINIMIZING CLOCK FEEDTHROUGH EFFECT AND HAVING LOW PHASE NOISE AND METHOD THEREOF

(75) Inventor: En-Hsiang Yeh, Hsin-Chu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 14 days.

(21) Appl. No.: 10/708,700

(22) Filed: Mar. 19, 2004

(65) Prior Publication Data

US 2005/0206434 A1    Sep. 22, 2005

(51) Int. Cl.
    *G06G 7/18*    (2006.01)
(52) U.S. Cl. .................. 327/337; 327/157; 331/117 R; 331/173
(58) Field of Classification Search ................ 327/337, 327/94, 156–158; 365/96, 225.7; 331/117 R, 331/173, 83, 109
    See application file for complete search history.

(56) References Cited

U.S. PATENT DOCUMENTS

| | | | |
|---|---|---|---|
| 6,353,368 B1 * | 3/2002 | Iravani | 331/57 |
| 6,661,693 B1 * | 12/2003 | Mullarkey et al. | 365/96 |
| 6,812,802 B1 * | 11/2004 | Godambe et al. | 331/183 |

* cited by examiner

*Primary Examiner*—Dinh T. Le
(74) *Attorney, Agent, or Firm*—Winston Hsu

(57) ABSTRACT

A switched capacitor circuit includes a capacitor; a switch element for selectively coupling a first node to a second node according to a control signal, wherein the first node is coupled to the capacitor; and a charge circuit coupled to the first node for coupling the first node to a third node and for controlling a first voltage difference across the first switch element in the off-state to be greater than a charge voltage. By ensuring the charge voltage is large enough to minimize a parasitic capacitance of the switch element, the clock feedthrough effect is eliminated, the locking period of the VCO is shortened, and the phase noise of the VCO is minimized.

38 Claims, 11 Drawing Sheets

US 7,002,393 B2

SWITCHED CAPACITOR CIRCUIT CAPABLE OF MINIMIZING CLOCK FEEDTHROUGH EFFECT AND HAVING LOW PHASE NOISE AND METHOD THEREOF

BACKGROUND OF INVENTION

1. Field of the Invention

The present invention relates to a switched capacitor circuit, and more particularly, to a switched capacitor circuit having low phase noise used in a voltage controlled oscillator (VCO) for minimizing the clock feedthrough effect and thereby preventing a VCO frequency drift phenomenon during the calibration and the synthesizer phase locking periods.

2. Description of the Prior Art

A voltage controlled oscillator (VCO) is commonly used for frequency synthesis in wireless communication circuits. As indicated by Welland, et al. in U.S. Pat. No. 6,226,506, a wireless communication system typically requires frequency synthesis in both its receiving and transmitting path circuitries.

FIG. 1 shows a prior art VCO circuit. An LC type VCO used in a frequency synthesizer contains a resonator 10 with a basic resonant structure including an inductor 12 connected between a first oscillator node OSC_P and a second oscillator node OSC_N. Connected in parallel with the inductor 12 is a continuously variable capacitor 14 and a plurality of discretely variable capacitors 16. The continuously variable capacitor 14 is used for fine-tuning a desired capacitance while the plurality of discretely variable capacitors 16 is used for coarse tuning. The resistive loss of the parallel combination of the inductor 12 and the capacitors 14, 16 is compensated by a negative resistance generator 18 for sustaining the oscillation.

Each discretely variable capacitor in the plurality of discretely variable capacitors 16 is made up of a switched capacitor circuit 20 and each switched capacitor circuit is controlled by an independent control signal (SW_1 to SW_N). Based on the control signal SW_N, the switched capacitor circuit 20 selectively connects or disconnects a capacitor 24 to the resonator 10 of the VCO. Different on/off combinations of the switched capacitor circuits 20 result in a wider capacitance range of the LC type resonator 10 and hence providing a wider VCO oscillation frequency coverage.

FIG. 2 shows a switched capacitor circuit 20a according to the prior art. A capacitor 30 is connected between the first oscillator node OSC_P and a node A. A switch element 32 selectively connects node A to ground, and the switch element 32 is controlled by a control signal SW. When the switch element 32 is turned on, the capacitance associated with the capacitor 30 is added to the overall capacitance in the VCO resonator 10. When the switch element 32 is turned off, the capacitance looking into the first oscillator node OSC_P is the serially combined capacitor 30 and the off state capacitance associated with the switch element 32.

FIG. 3 shows a differential type switched capacitor circuit 20b according to the prior art. The differential type switched capacitor circuit has a much greater common-mode noise rejection ratio and is thus widely used in high-speed integrated circuit environments. In the differential switched capacitor circuit 20b, a positive side capacitor 40 is connected between the first oscillator node OSC_P and a node A. A positive side switch element 42 selectively connects node A to ground. A negative side capacitor 44 is connected between the second oscillator node OSC_N and a node B. A negative side switch element 46 selectively connects node B to ground. The two switch elements 42, 46 are controlled by the same control signal SW. When the switch elements 42, 46 are turned on, the capacitance associated with the serially combined of the positive and negative side capacitors 40, 44 is added to the overall capacitance in the VCO resonator 10. When the switch elements 42, 46 are turned off, the differential input capacitance is the serially combined of the positive and negative side capacitors 40, 44 and the parasitic capacitances of the switch elements 42 and 46. The overall input capacitance when both switch elements 42, 46 are turned off is lower than that when both switch elements 42, 46 are turned on.

FIG. 4 shows a second differential type switched capacitor circuit 20c according to the prior art. The second differential switched capacitor circuit 20c includes the same components as shown in the first differential switched capacitor circuit 20b except an additional center switch element 48 is used to lower the overall turn-on switch resistance connected between the nodes A and B. All three switch elements 42, 46, 48 are controlled by the same control signal SW. When the switch elements 42, 46, 48 are turned on, the capacitance associated with the serially combined positive and negative side capacitors 40, 44 is added to the overall capacitance in the VCO resonator 10. When the switch elements 42, 46, 48 are turned off, the differential input capacitance is the serially combined positive and negative side capacitors 40, 44 and the parasitic capacitances of the switch elements 42, 46 and 48. The overall input capacitance when all switch elements 42, 46, 48 are turned off is lower than that when all switch elements 42, 46, 48 are turned on.

Regardless of whether the single ended implementation shown in FIG. 2 or one of the differential implementations shown in FIG. 3 and FIG. 4 is used, when the switched capacitor circuit 20a, 20b, 20c is turned off, a momentary voltage step change occurs at node A (and, in the case of the differential implementations, also at node B). The momentary voltage step causes an undesired change in the overall capacitance, and ultimately, an undesired change in the VCO frequency. Because NMOS switches are used in the examples shown in FIG. 2, FIG. 3, and FIG. 4, the momentary voltage step change is a voltage drop when the switch elements 32, 42, 46, 48 are turned off. In other p-type transistor based implementations, the momentary voltage step could also be a voltage spike.

Using the single ended case shown in FIG. 2 as an example, when the switch element 32 is turned off, charge carriers are injected into the junction capacitance connected between the first terminal and the second terminal of the switch element 32. The injection produces an undesired voltage step change across the capacitive impedance and appears as a voltage drop at node A. This effect is known as the clock feedthrough effect and appears as a feedthrough of the control signal SW from the control terminal of the switch element 32 to the first and second terminals of the switch element 32. When the switch element 32 is turned on, node A is connected to ground so the feedthrough of the control signal SW is of no consequence. However, when the switch element 32 is turned off, the feedthrough of the control signal SW causes a voltage step, in the form a voltage drop in the implementation shown in FIG. 2, to appear at node A. Because of the dropped voltage at node A, the diode formed by the N⁺ diffusion of the switch element 32 and the P type substrate in the off state will be slightly forward biased. The voltage level at node A will spike low and then recover to ground potential as the slightly forward biased junction diode formed by the switch element 32 in the off state allows subthreshold and leakage currents to flow. The voltage drop and recovery at node A changes the loaded capacitance of the VCO resonator 10 and causes an undesired momentarily drift in the VCO frequency.

Similarly, when the differential switched capacitor circuit 20c shown in FIG. 4 switches off, it suffers from the same clock feedthrough effect problem at node A and at node B. The positive side node A has an undesired voltage step change caused by the clock feedthrough effect of both the positive side switch element 42 and the center switch element 48. Similarly, the negative side node B has an undesired voltage step change caused by the clock feedthrough effect of both the negative side switch element 46 and the center switch element 48. The voltage step change and recovery at node A and node B changes the loaded capacitance of the VCO resonator 10 and causes an undesired momentary drift in the VCO frequency.

SUMMARY OF INVENTION

One objective of the claimed invention is therefore to provide a switched capacitor circuit capable of minimizing the clock feedthrough effect to solve the above-mentioned problem of an undesired momentary drift in the voltage controlled oscillator frequency.

According to the claimed invention, a switched capacitor circuit is disclosed comprising a capacitor; a first switch element for selectively coupling a first node to a second node according to a control signal, wherein the first node is coupled to the capacitor; and a charge circuit coupled to the first node for coupling the first node to a third node and for controlling a voltage difference across the first switch element in the off-state to approach a predetermined charge voltage.

Also according to the claimed invention, a switched capacitor circuit is disclosed comprising: a positive side capacitor; a negative side capacitor{904}; a first positive side switch element{906} for selectively coupling a first positive side node{node A} to a second node{GND/VDD} according to a control signal{SW}, wherein the first positive side node is coupled to the positive side capacitor; a first negative side switch element{908} for selectively coupling a first negative side node{node B} to the second node{GND/VDD} according to the control signal{SW}, wherein the first negative side node{node B} is coupled to the negative side capacitor{902}; and a charge circuit{912} coupled to the first positive side node{node A} and the first negative side node for coupling the first positive side node and the first negative side node to a third node{VDD/GND} and for controlling a first voltage difference across the first positive side switch element in the off-state and a second voltage difference across the first negative side switch element in the off-state to approach a predetermined charge voltage.

Also according to the claimed invention, a method is disclosed for controlling a switched capacitor circuit, the method comprising the following steps: providing a capacitor and a first switch element; disconnecting a first node from a second node according to a control signal utilizing the first switch element, wherein the first node is coupled to the capacitor; and coupling the first node to a third node for controlling a voltage difference across the first switch element in the off-state to approach a predetermined charge voltage.

Also according to the claimed invention, a method is disclosed for controlling a switched capacitor circuit, the method comprising the following steps: providing a positive side capacitor and a first positive side switch element; providing a negative side capacitor and a first negative side switch element; disconnecting a first positive side node and a first negative side node from the second node according to the control signal respectively utilizing the first positive side switch element and the first negative side switch element, wherein the first positive side node is coupled to the positive side capacitor and the first negative side node is coupled to the negative side capacitor; and coupling the first positive side node and the first negative side node to the third node such that a first voltage difference across the first positive side switch element in the off-state and a second voltage difference across the first negative side switch element in the off-state both approach a predetermined charge voltage.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
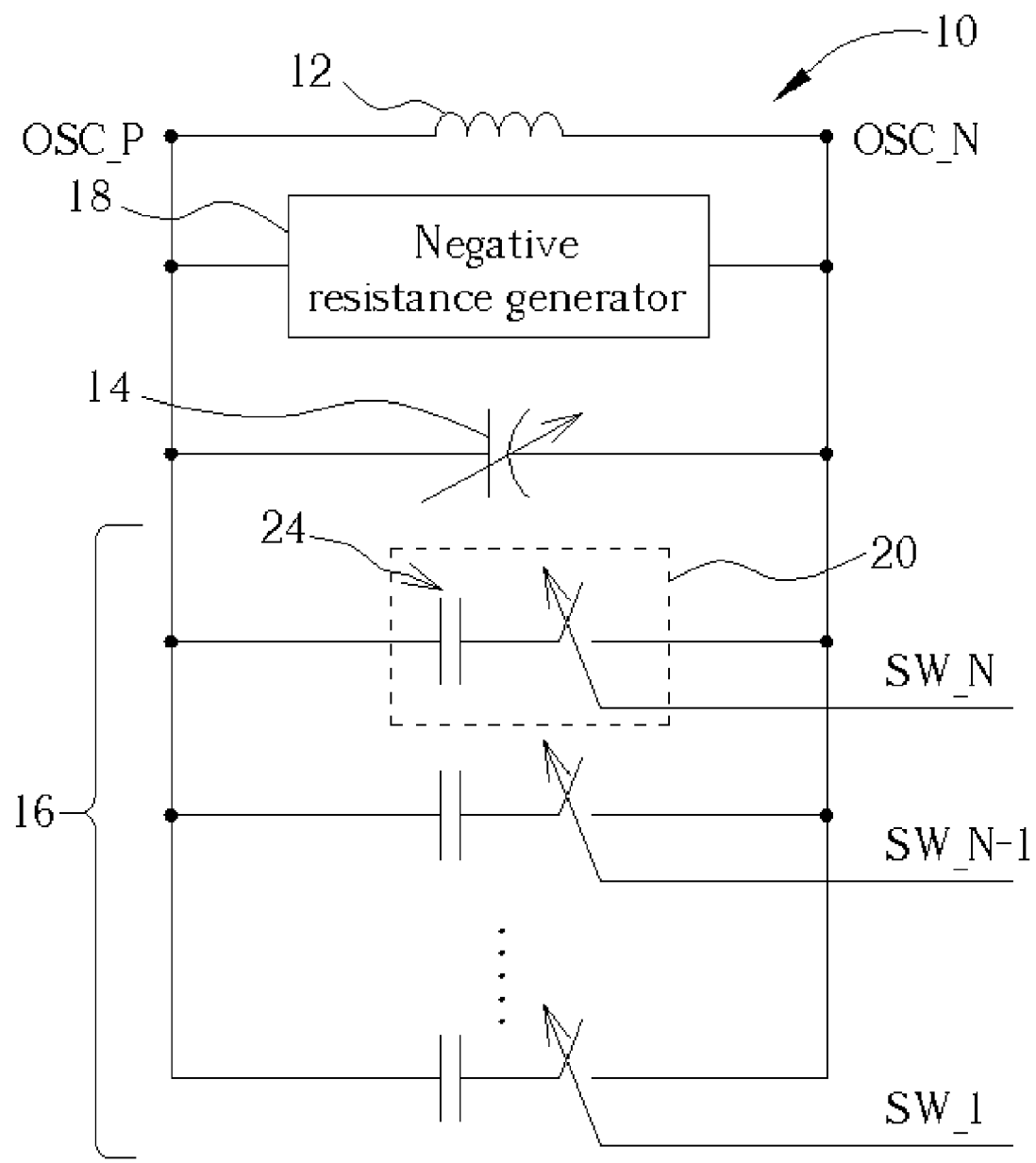
FIG. 1 is a schematic diagram of a prior art Voltage Controlled Oscillator (VCO) circuit used in a frequency synthesizer.
Figure 2:
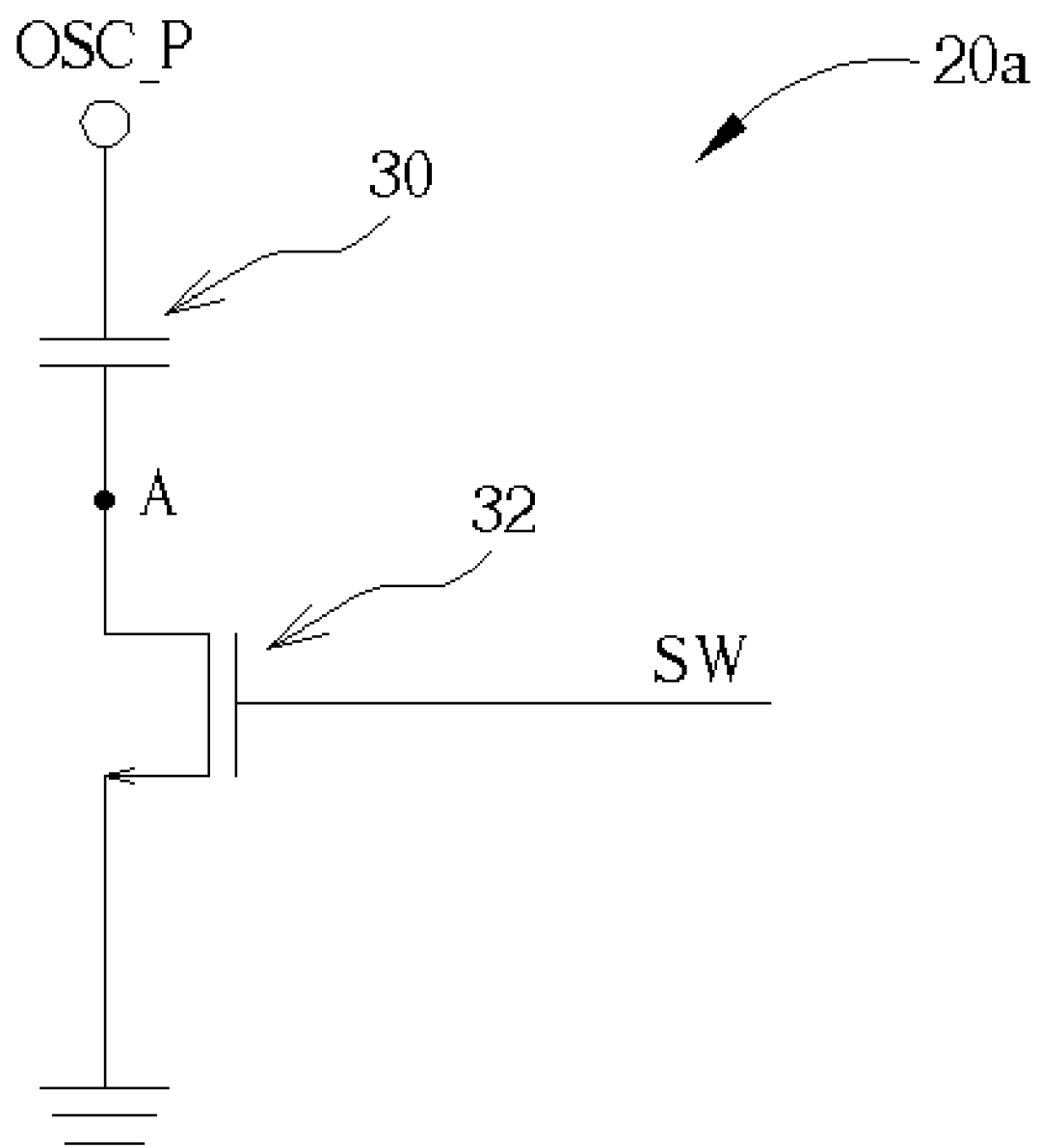
FIG. 2 is a switched capacitor circuit used in the VCO of FIG. 1 according to the prior art.
Figure 3:
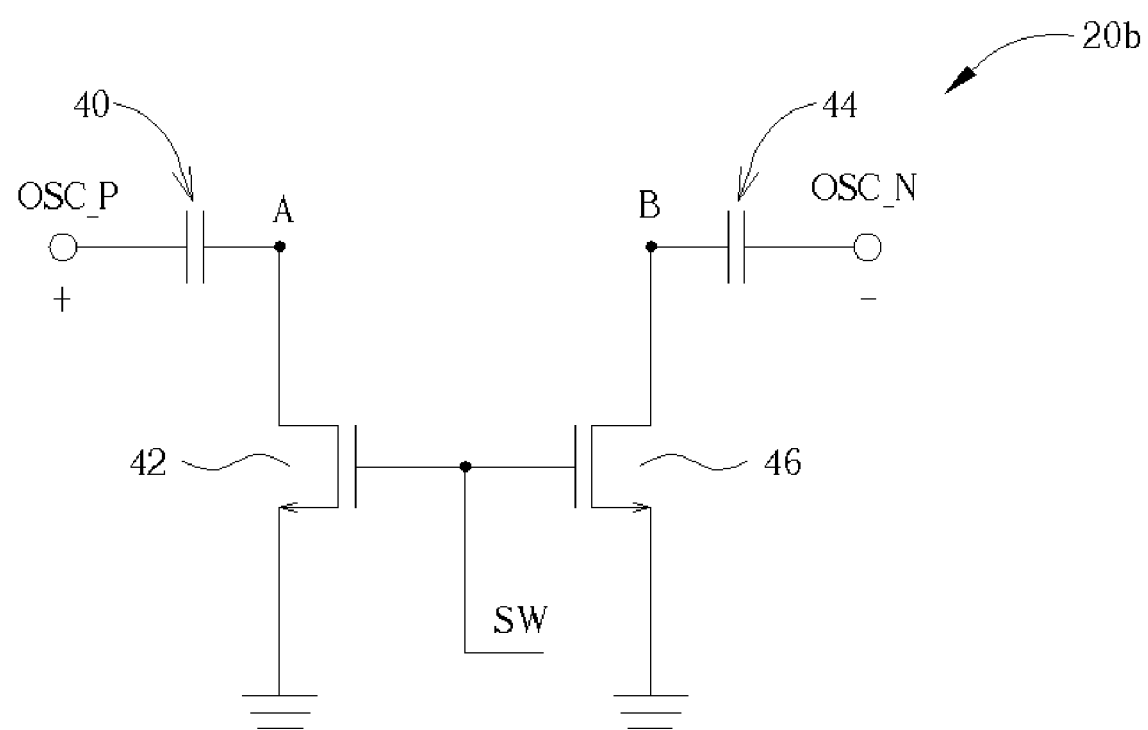
FIG. 3 is a differential type switched capacitor circuit used in the VCO of FIG. 1 according to the prior art.
Figure 4:
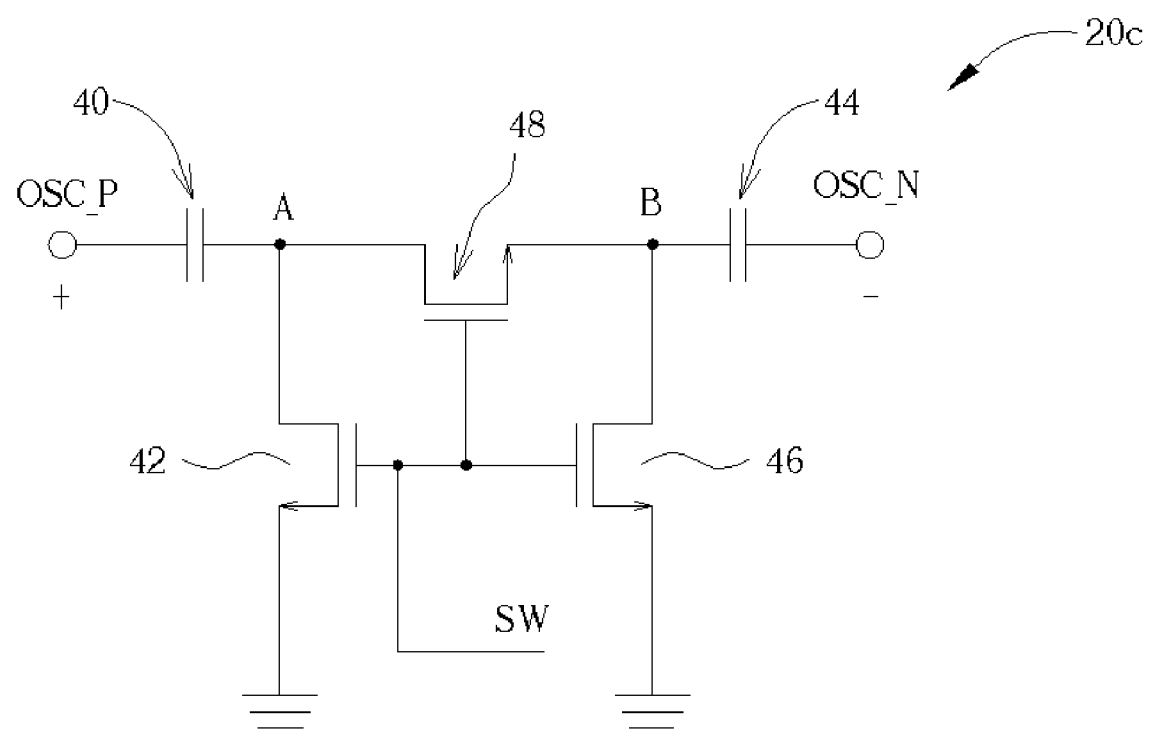
FIG. 4 is the differential type switched capacitor circuit of FIG. 3 with the addition of a center switch element.
Figure 5:
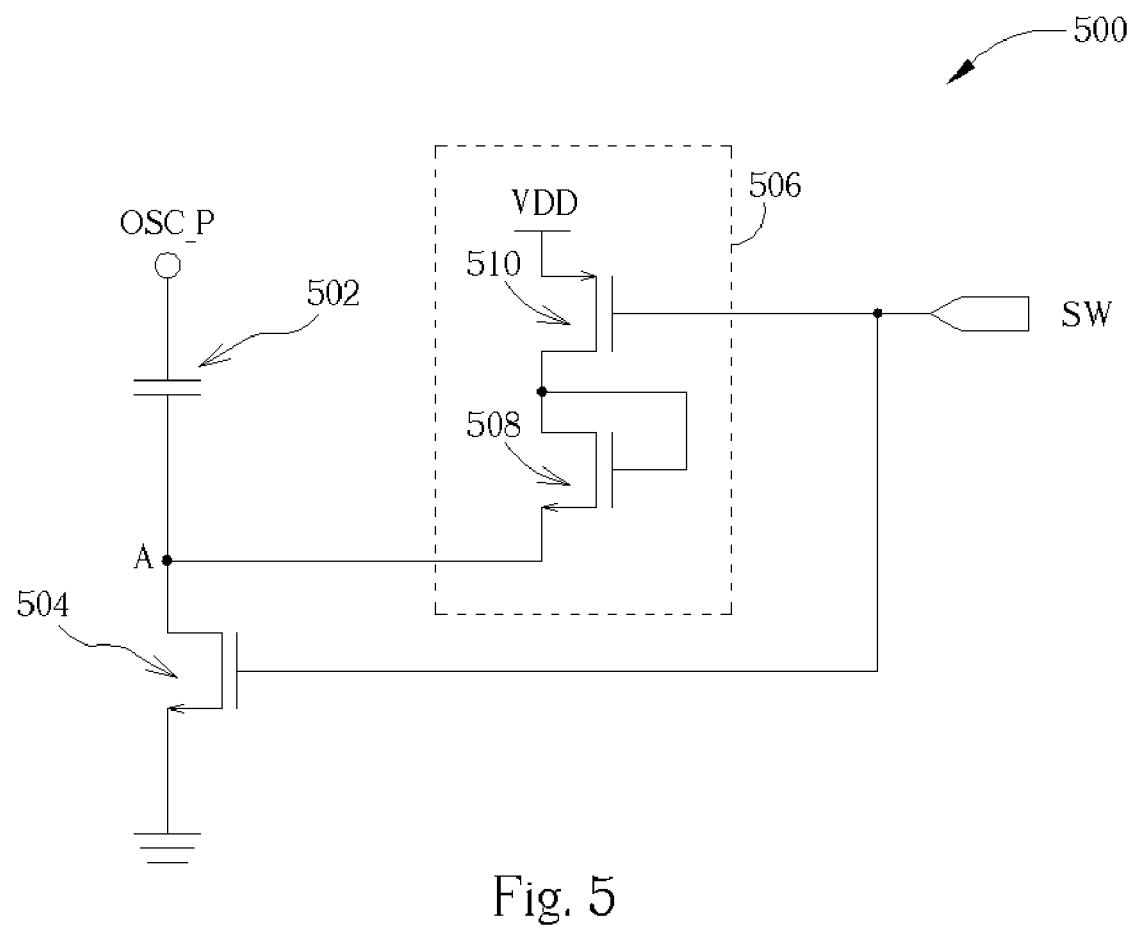
FIG. 5 is a switched capacitor circuit according to a first embodiment of the present invention.

FIG. 5 shows a switched capacitor circuit 500 according to a first embodiment of the present invention. In FIG. 5, the switched capacitor circuit 500 comprises a capacitor 502, a first switch element 504, and a charge circuit 506. The charge circuit 506 includes a second switch element 508 (configured as a diode), and a third switch element 510. The capacitor 502 is connected between the first oscillator node OSC_P and a node A. The first switch element 504 selectively connects node A to the second node, which is ground, according to a control signal SW. The charge circuit 506 is connected to node A for coupling node A to a supply voltage VDD when the switched capacitor circuit 500 is switched off according to the control signal SW. To switch off the switched capacitor circuit 500, the control signal SW drops to a logic low value. The charge circuit 506 couples node A to the supply voltage VDD, charging node A and preventing the momentary voltage step at node A caused by the clock feedthrough effect. Additionally, a parasitic capacitance associated with the parasitic diode formed by the first switch element 504 in the off position is minimized by the constant voltage formed across the first switch element 504 by the charge circuit 506, and a phase noise of the VCO circuit is thereby reduced. It should also be noted that because the second switch element 508 has its gate and drain shorted together, it is equivalent to a diode. For this reason, the second switch element 508 could also be replaced with a diode.

Figure 6:
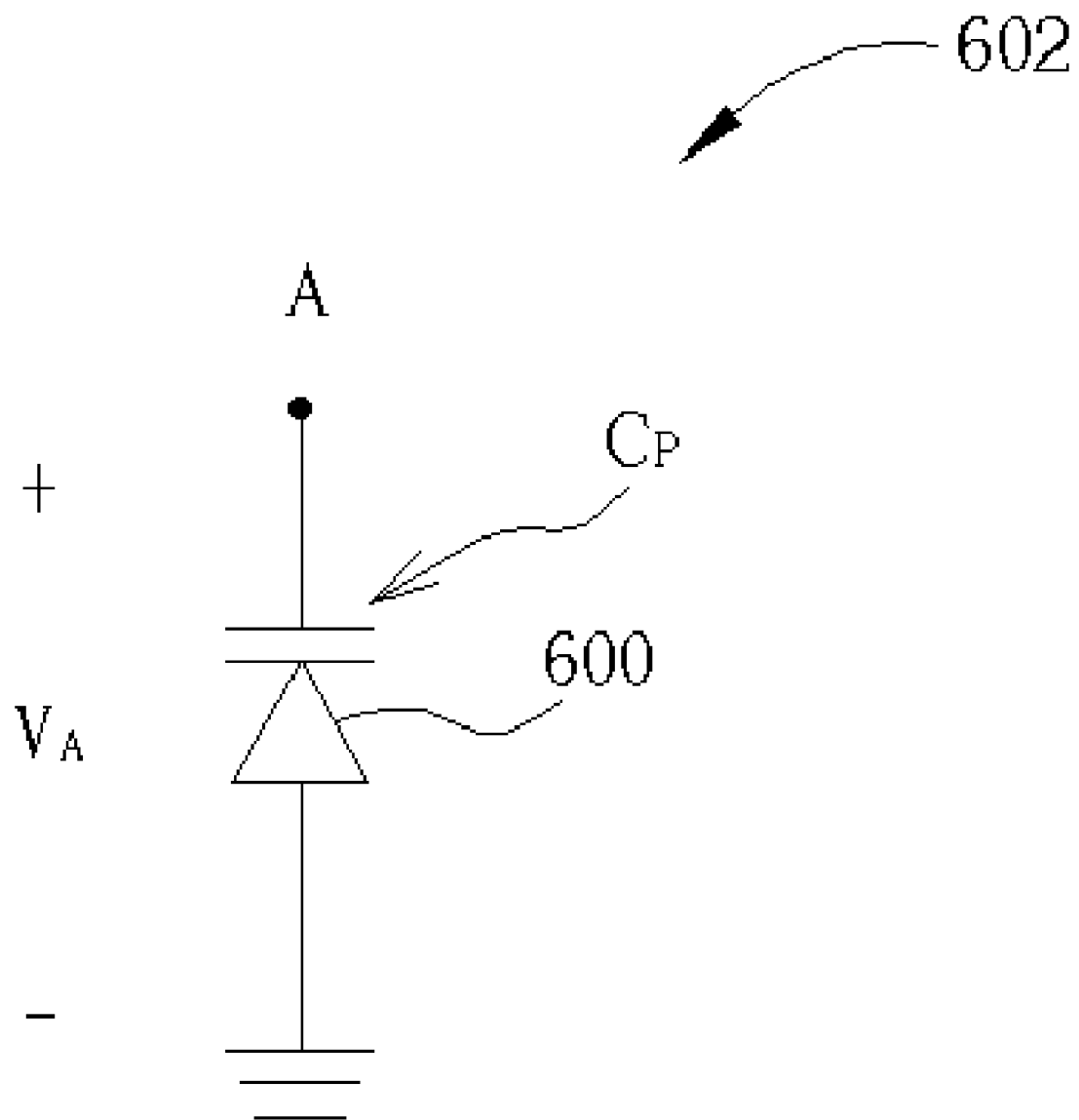
FIG. 6 is a parasitic diode formed by the switch element in FIG. 5 in the off position.

FIG. 6 shows a parasitic diode 600 formed by the first switch element 504 in the off position in FIG. 5. The parasitic diode 600 acts as a varactor 602 connected between the node A and the second node, which is ground in the first embodiment of the present invention. The varactor 602 has a parasitic capacitance of $C_p$ determined by the voltage $V_A$ at node A in FIG. 5.

Figure 7:
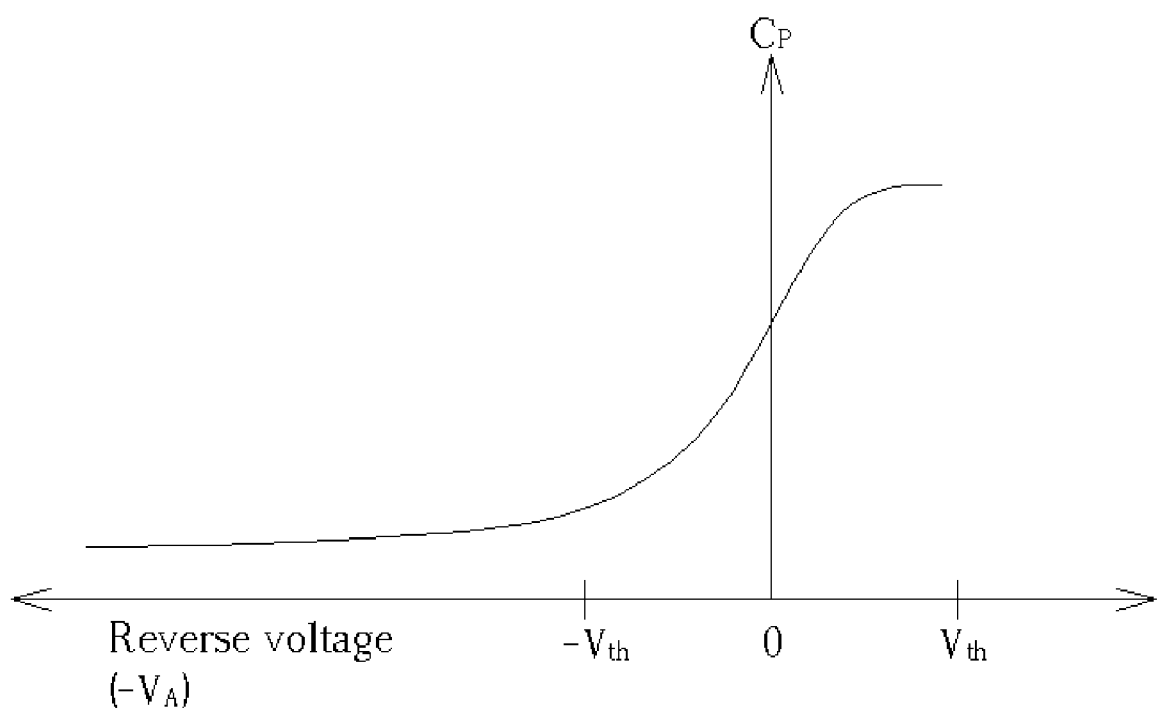
FIG. 7 is a capacitance vs. reverse voltage diagram of the parasitic diode shown in FIG. 6.

FIG. 7 shows a capacitance vs. reverse voltage diagram of the varactor 602 shown in FIG. 6. As the reverse voltage ($-V_A$) across the varactor 602 changes, the associated parasitic capacitance $C_p$ changes. However, this change is not linear. Reverse voltages within the threshold voltage $V_{th}$ of the first switch element 52 have the greatest parasitic capacitance $C_p$ changes. The present invention uses this fact to charge node A to a voltage much larger than the threshold voltage of the switch element 52. This means that if charge on node A leaks to ground through the first switch element 32, the parasitic capacitance will remain approximately the same. In this way, the locking period of the VCO is shortened and the present invention allows the frequency synthesizer to reach a stable state faster than the prior art implementations.

Figure 8:
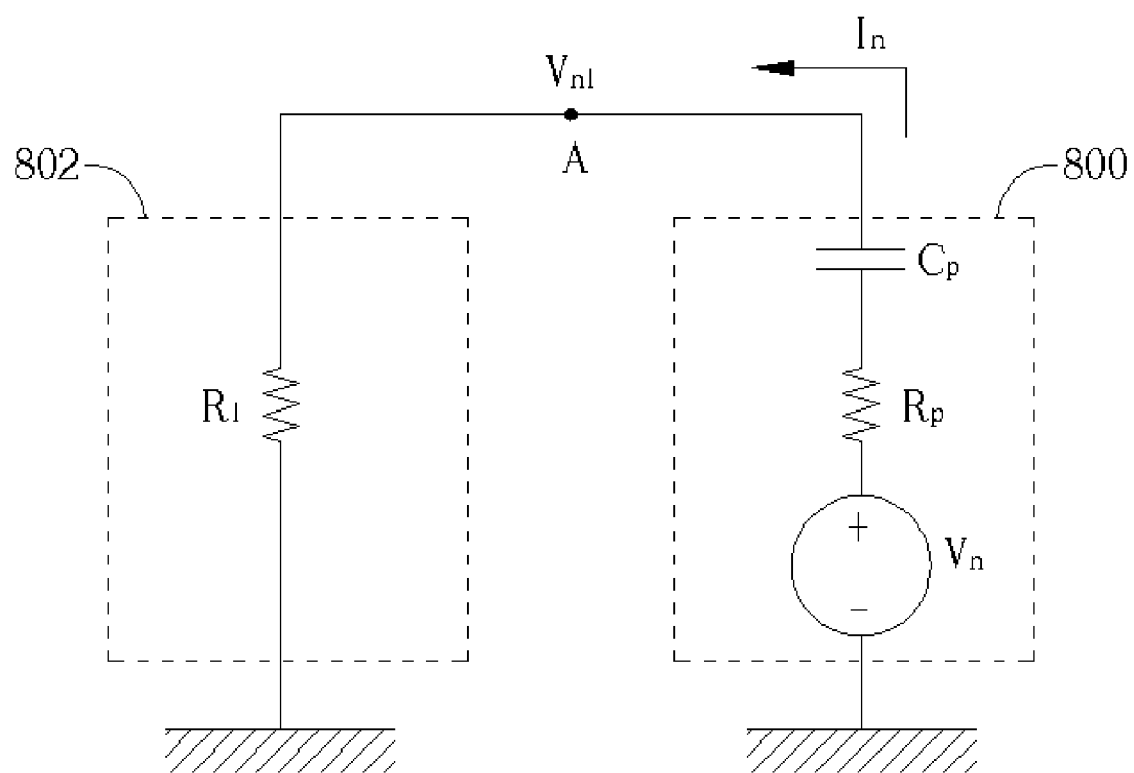
FIG. 8 shows an equivalent switch element of FIG. 5 and an equivalent VCO.

FIG. 8 shows an equivalent switch element 800 and an equivalent VCO 802. The equivalent switch element 800 formed by the first switch element 504 of FIG. 5 in the off position includes a parasitic resistance $R_p$, the parasitic capacitance $C_p$, and a noise source $V_n$, which comes from substrate noise and thermal noise. The equivalent VCO 802 includes a resistor $R_1$, the value of which is equal to the equivalent impedance of the VCO circuit. The current $I_n$ flowing through node A is determined from the following formula:

$$I_n = \frac{V_{n1}}{R_1} = \frac{V_n}{R_1 + R_p + \frac{1}{2\pi f \cdot C_p}} \quad \text{(formula 1)}$$

where f is the frequency of the VCO oscillation and $V_{n1}$ is the overall noise, which contributes to the phase noise of the VCO circuit seen at node A.

By solving formula 1 for the overall phase noise $V_{n1}$, the following formula is obtained:

$$V_{n1} = \frac{V_n \cdot R_1}{\left(R_1 + R_p + \frac{1}{2\pi f \cdot C_p}\right)} \quad \text{(formula 2)}$$

At a constant frequency value such as 1 GHz, it can be seen from the above formulas that by minimizing the parasitic capacitance $C_p$ of the equivalent switch element 800, the overall noise $V_{n1}$ is minimized. Therefore, it desirable to have a low parasitic capacitance $C_p$. Because of this, the present invention provides a constant reverse bias voltage $V_A$ across the varactor 602, which produces a smaller $C_p$ value and reduces the phase noise. By coupling node A to a constant supply voltage, the voltage $V_A$ at node A approaches a constant potential of VDD$V_{510}$–$V_{508}$, where $V_{510}$ and $V_{508}$ are the voltage differences across the switch elements 510 and 508, respectively. Furthermore, $V_{510}$ is a small value as compared with $V_{508}$, and therefore, $V_A$ is basically equal to VDD $V_{508}$. In this way, the phase noise associated with the switched capacitor circuit 500 according to the present invention is lower than that of the prior art implementations. By ensuring the reverse bias voltage $V_A$ is greater than a predetermined threshold, the present invention can reduce the noise $V_{n1}$ on node A and hence the phase noise of the VCO is reduced to a desired level.

Figure 9:
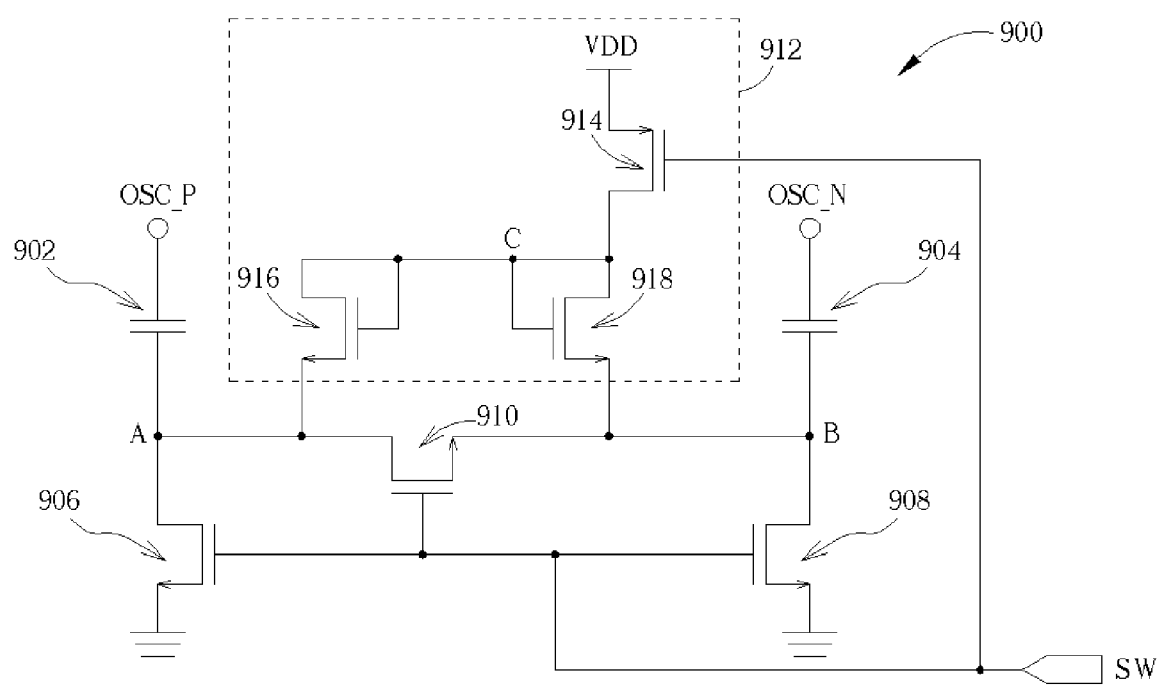
FIG. 9 is a differential switched capacitor circuit according to a second embodiment of the present invention.

FIG. 9 is a differential switched capacitor circuit 900 according to a second embodiment of the present invention. The differential switched capacitor circuit 900 comprises a positive side capacitor 902, a negative side capacitor 904, a first positive side switch element 906, a first negative side switch element 908, a center switch element 910, and a charge circuit 912. In the second embodiment of the present invention, the charge circuit 912 includes a second positive side switch element 916, a second negative side switch element 918, and a third switch element 914.

The positive side capacitor 902 is connected between the first oscillator node OSC_P and a node A, and the negative side capacitor 904 is connected between the second oscillator node OSC_N and a node B. The first positive side switch element 906 selectively connects node A to ground according to a control signal SW, and the first negative side switch element 908 selectively connects node B to ground according to the control signal SW. In the preferred differential embodiment of the present invention, the center switch element 910 selectively connects node A to node B according to the control signal SW, however, other embodiments not including the center switch 910 are also fully supported by the present invention. The charge circuit 912 is connected to node A and node B for precharging nodes A and B to a charge voltage when the switched capacitor circuit 900 is switched off according to the control signal SW. In this embodiment, the charge voltage is substantially equal to the constant supply voltage VDD minus the voltage drops across the third switch element 914 and the second positive and negative side switch elements 916, 918; however, other constant charge voltages are also acceptable. In the charge circuit 912, the third switch element 914 selectively couples a node C to the constant supply voltage VDD according to the control signal SW. The gate and the drain of the second positive side switch element 916 are connected to node C and the source of the second positive side switch element 916 is connected to node A. Likewise, the gate and the drain of the second negative side switch element 918 are connected to node C and the source of the second negative side switch element 918 is connected to node B.

As in the single ended embodiment shown in FIG. 5, to switch off the differential switched capacitor circuit 900, the control signal SW drops to a logic low value. The charge circuit 912 then couples node A and node B to the charge voltage VDD, charging nodes A and B and preventing the momentary voltage step at nodes A and B caused by the clock feedthrough effect. More specifically, the third switch element 914 couples node C to the constant supply voltage VDD (minus a small voltage drop across the third switch element 914), and the second positive and negative switch elements 916, 918 act as forward biased diodes and couple node C to nodes A and B (minus a small voltage drop across the second positive and negative switch element 916, 918, respectively). Additionally, the parasitic capacitance $C_p$ associated with the varactors 63 formed by the first positive side switch element 906, the first negative side switch element 908 and the center switch 910 in the off position is minimized, which reduces the phase noise of the VCO.

Figure 10:
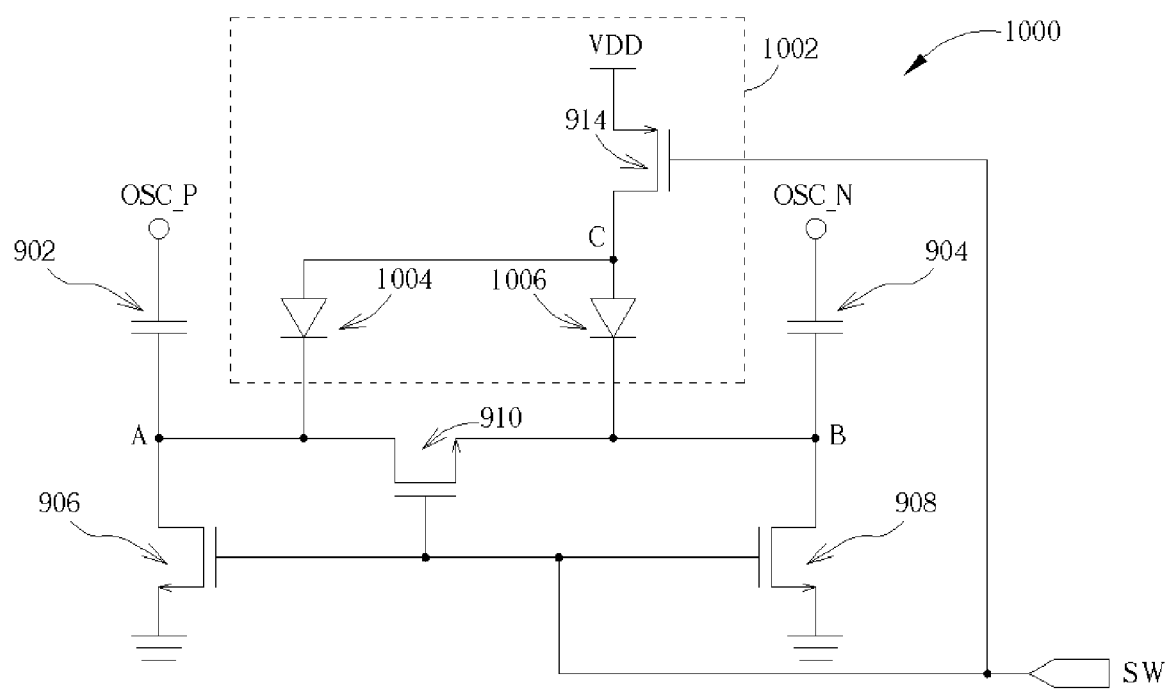
FIG. 10 is a differential switched capacitor circuit according to a third embodiment of the present invention.

FIG. 10 is a differential switched capacitor circuit according to a third embodiment of the present invention. The differential switched capacitor circuit 1000 according to the third embodiment of the present invention comprises the same components as the differential switched capacitor circuit according to the second embodiment, however, in the third embodiment, the second positive switch element 916 and the second negative switch element 918 have been replaced with a first diode 1004 and a second diode 1006, respectively. Because the gate and the drain of the second positive side switch element 916 are shorted together and because the gate and the drain of the second negative side switch element 918 are shorted together, the second positive and negative switch elements 916, 918 are actually acting as forward biased diodes when the capacitor switch is in the off-state. In FIG. 9, the cathodes of the first diode 1004 and the second diode 1006 are connected to nodes A and B, respectively. The anodes of the first diode 1004 and the second diode 1006 are connected directly to the constant power supply VDD. In this way, the charge circuit ensures the that when the capacitor switch 1000 is in the off state (controlled according to the control signal SW), the voltage difference across the first positive and negative switch elements 906, 908 is equal to the constant voltage VDD minus the voltage drops associated with the second switch element 914 and the respective voltage drops of the first and second diodes 1004, 1006. It should be noted that in other embodiments of the present invention, different constant supply voltages other than VDD can also be used.

Figure 11:
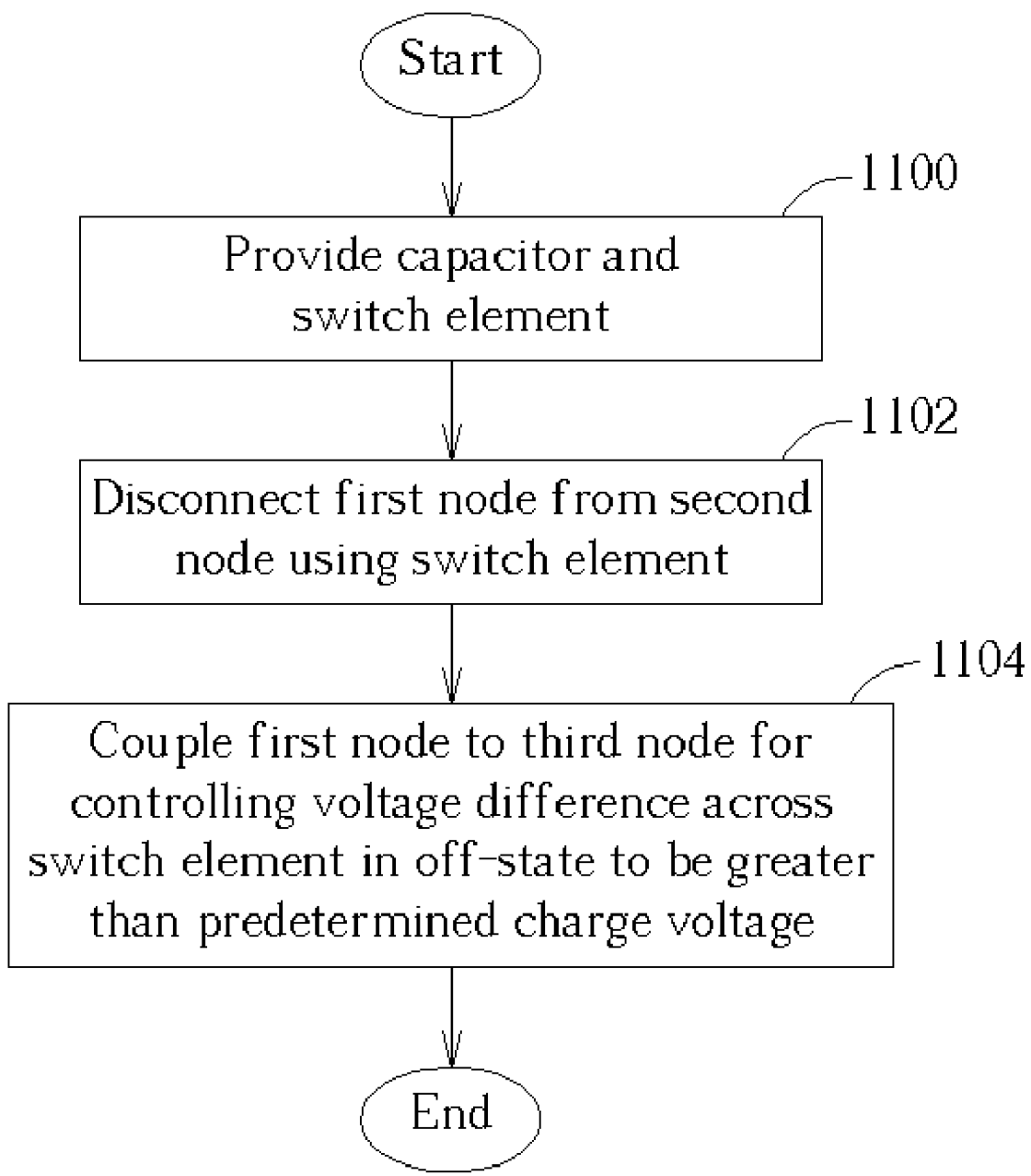
FIG. 11 is a flowchart describing a method of controlling a switched capacitor circuit according to the present invention.

FIG. 11 is a flowchart describing a general method of controlling a switched capacitor circuit according to the present invention. The flowchart includes the following steps:

Step 1100: Provide a capacitor and a switch element. One terminal of the capacitor is connected to a first node, and the first node is connected to the switch element.

Step 1102: Disconnect the first node from a second node using the switch element.

Step 1104: Couple the first node to a third node for controlling a voltage difference across the switch element in the off-state to be greater than a predetermined charge voltage. The charge voltage can be substantially equal to a constant voltage such as VDD (minus some small voltage drops associated with the coupling of the first node to the third node), or another voltage level that ensures the parasitic capacitance $C_p$ of the switch element is minimized. In this way, the clock feedthrough effect is eliminated, the locking period of the VCO is shortened, and the phase noise of the VCO is minimized.

It should also be noted that although MOS transistors are used as the switch devices throughout the diagrams of the detailed description of the preferred embodiment, this is for example only and BJT transistors are also supported by the present invention. Using BJTs, because the second switch element 508 has its base and collector shorted together, it is configured as a diode. Additionally, both positive and negative logic can be used with respect to the control signal SW. In the embodiment of a logic low on the control signal SW causing the switched capacitor circuit to disconnect the capacitor from the VCO (as shown in the diagrams throughout the detailed description of the preferred embodiment), the first (positive and negative) switch{504} elements 504, 906, 908 are n-type transistors, the third switch{510} elements 510, 914 are p-type transistors, the second node{ground} is ground, and the third node{VDD} is a constant supply voltage. In an alternate embodiment of a logic high on the control signal SW causing the switched capacitor circuit to disconnect the capacitor from the VCO, the first (positive and negative) switch{504} elements 504, 906, 908 are p-type transistors, the third switch{510} elements 510, 914 are n-type transistors, the second node{VDD} is a constant supply voltage, and the third node{GND} is ground.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A switched capacitor circuit used in an oscillator circuit, the switched capacitor comprising:
   a capacitor;
   a first switch element for selectively coupling a first node to a second node according to a control signal, wherein the first node is coupled to the capacitor, the capacitor is further connected to an oscillation node in the oscillator circuit; and
   a charge circuit coupled to the first node for coupling the first node to a third node being at a first predetermined charge voltage responsive to said control signal, wherein when the first switch element is switched off, the charge circuit controls a voltage difference across the first switch element to approach a second predetermined charge voltage.

2. The switched capacitor circuit of claim 1, wherein the charge circuit selectively couples the first node to the third node according to the control signal.

3. The switched capacitor circuit of claim 2, wherein the charge circuit comprises:
   a diode coupled between the first node and a fourth node; and
   a second switch element for selectively coupling the fourth node to the third node according to the control signal.

4. The switched capacitor circuit of claim 3, wherein:
   the diode is firmed by a transistor having its base and collector being shorted together, or having its gate and drain being shorted together.

5. The switched capacitor circuit of claim 3, wherein:
   the first switch element is an n-type transistor;
   the second switch element is a p-type transistor;
   the second node is ground; and
   the third node is a constant supply voltage.

6. The switched capacitor circuit of claim 3, wherein:
   the first switch element is a p-type transistor;
   the second switch element is an n-type transistor;
   the second node is a constant supply voltage; and
   the third node is ground.

7. A switched capacitor circuit comprising:
   a positive side capacitor;
   a negative side capacitor;
   a first positive side switch element for selectively coupling a first positive side node to a second node according to a control signal, wherein the first positive side node is coupled to the positive side capacitor;
   a first negative side switch element for selectively coupling a first negative side node to the second node according to the control signal, wherein the first negative side node is coupled to the negative side capacitor; and a charge circuit coupled to the first positive side node and the first negative side node for coupling the first positive side node and the first negative side node to a third node being at a first predetermined charge voltage, wherein when the first positive side switch element and the first negative side switch element are switched off, the charge circuit controls a first voltage difference across the first positive side switch element and a second voltage difference across the first negative side switch element to approach a second predetermined charge voltage.

8. The switched capacitor circuit of claim 7, wherein the charge circuit selectively couples the first positive side node and the first negative side node to the third node according to the control signal.

9. The switched capacitor circuit of claim 8, wherein the charge circuit comprises:
a positive side diode coupled between the first positive side node and a fourth node;
a negative side diode coupled between the first negative side node and a fourth node; and
a second switch element for selectively coupling the fourth node to the third node according to the control signal.

10. The switched capacitor circuit of claim 9, wherein:
the positive side diode is formed by a first transistor having its base and collector being shorted together, or having its gate and drain being shorted together; and
the negative side diode is formed by a second transistor having its base and collector being shorted together, or having its gate and drain being shorted together.

11. The switched capacitor circuit of claim 9, wherein:
the first positive side switch element is an n-type transistor;
the first negative side switch element is an n-type transistor;
the second switch element is a p-type transistor;
the second node is ground; and
the third node is a constant supply voltage.

12. The switched capacitor circuit of claim 9, wherein:
the first positive side switch element is a p-type transistor;
the first negative switch element is a p-type transistor;
the second switch element is an n-type transistor;
the second node is a constant supply voltage; and
the third node is ground.

13. The switched capacitor circuit of claim 7, further comprising a center switch element for selectively coupling the first positive side node to the first negative side node according to the control signal.

14. A method for controlling a switched capacitor circuit, the method comprising the following steps:
connecting a capacitor to an oscillator
connecting said capacitor to a first switch element at a first node;
disconnecting said first node from a second node according to a control signal utilizing second switch element, wherein the first node is coupled to the first switch; and
coupling the first node to a third node being at a first predetermined charge voltage responsive to said control signal for controlling a voltage difference across the first switch element in the off-state to approach a second predetermined charge voltage.

15. The method of claim 14, further comprising selectively coupling the first node to the third node according to the control signal.

16. The method of claim 15, wherein selectively coupling the first node to the third node according to the control signal comprises:
providing a diode coupled between the first node and a fourth node; and
providing a second switch element for selectively coupling the fourth node to the third node according to the control signal.

17. The method of claim 16, wherein:
the diode is formed by a transistor having its base and collector being shorted together or having its gate and drain being shorted together.

18. The method of claim 16, wherein:
the first switch element is an n-type transistor;
the second switch element is a p-type transistor;
the second node is ground; and
the third node is a constant supply voltage.

19. The method of claim 16, wherein:
the first switch element is a p-type transistor;
the second switch element is an n-type transistor;
the second node is a constant supply voltage; and
the third node is ground.

20. A method for controlling a switched capacitor circuit, the method comprising the following steps:
providing a positive side capacitor and a first positive side switch element;
providing a negative side capacitor and a first negative side switch element;
disconnecting a first positive side node and a first negative side node from the second node according to the control signal respectively utilizing the first positive side switch element and the first negative side switch element, wherein the first positive side node is coupled to the positive side capacitor and the first negative side node is coupled to the negative side capacitor; and
coupling the first positive side node and the first negative side node to the third node being at a first predetermined charge voltage, such that when the first positive side switch element and the first negative side switch element are switched off, a first voltage difference across the first positive side switch element and a second voltage difference across the first negative side switch element both approach to a second predetermined charge voltage.

21. The method of claim 20, further comprising selectively coupling the first positive side node and the first negative side node to the third node according to the control signal.

22. The method of claim 21, wherein selectively coupling the first positive side node and the first negative side node to the third node according to the control signal comprises:
providing a positive side diode coupled between the first positive side node and a fourth node; and
providing a negative side diode coupled between the first negative side node and a fourth node; and
providing a second switch element for selectively coupling the fourth node to the third node according to the control signal.

23. The method of claim 22, wherein:
the positive side diode is formed by a first transistor having its base and collector being shorted together, or by having its gate and drain being shorted together; and
the negative side diode is formed by a second transistor having its base and collector being shorted together, or having its gate and drain being shorted together.

24. The method of claim 23, wherein:
the first positive side switch element is an n-type transistor;
the first negative side switch element is an n-type transistor;
the second switch element is a p-type transistor;
the second node is ground; and
the third node is a constant supply voltage.

25. The method of claim 23, wherein:
the first positive side switch element is a p-type transistor;
the first negative switch element is a p-type transistor;
the second switch element is an n-type transistor;
the second node is a constant supply voltage; and
the third node is ground.

26. The method of claim 20, further comprising selectively coupling the first positive side node to the first negative side node according to the control signal utilizing a center switch element.

27. A switched capacitor circuit comprising:
a capacitor;
a first switch element for selectively coupling a first node to a second node according to a control signal, wherein the first node is coupled to the capacitor; and
a charge circuit for coupling the first node to a third node being at a first predetermined charge voltage responsive to said control signal when the first switch element is switched off to thereby control a voltage at the first node to approach a second predetermined charge voltage when the first switch element is switched off.

28. The switched capacitor circuit of claim 27, wherein the charge circuit comprises:
a diode coupled between the first node and a fourth node; and
a second switch element for selectively coupling the fourth node to the third node according to the control signal.

29. The switched capacitor circuit of claim 28, wherein:
the diode is formed by a transistor having its base and collector being shorted together, or having its gate and drain being shorted together.

30. The switched capacitor circuit of claim 28, wherein:
the first switch element is an n-type transistor,
the second switch element is a p-type transistor,
the second node is ground; and
the third node is a constant supply voltage.

31. The switched capacitor circuit of claim 28, wherein:
the first switch element is a p-type transistor;
the second switch element is an n-type transistor;
the second node is a constant supply voltage; and
the third node is ground.

32. A switched capacitor circuit comprising:
a positive side capacitor;
a negative side capacitor;
a first positive side switch element for selectively coupling a first positive side node to a second node according to a control signal, wherein the first positive side node is coupled to the positive side capacitor;
a first negative side switch element for selectively coupling a first negative side node to the second node according to the control signal, wherein the first negative side node is coupled to the negative side capacitor; and
a charge circuit for coupling the first positive side node and the first negative side node to a third node being at a first predetermined charge voltage to control a voltage at the first positive side node and a voltage at the second positive side node to approach a second predetermined charge voltage when the first positive side switch element and the first negative side switch element are switched off.

33. The switched capacitor circuit of claim 32, wherein the charge circuit selectively couples the first positive side node and the first negative side node to the third node according to the control signal.

34. The switched capacitor circuit of claim 33, wherein the charge circuit comprises:
a positive side diode coupled between the first positive side node and a fourth node;
a negative side diode coupled between the first negative side node and a fourth node; and
a second switch element for selectively coupling the fourth node to the third node according to the control signal.

35. The switched capacitor circuit of claim 34, wherein:
the positive side diode is formed by a first transistor having its base and collector being shorted together, or having its gate and drain being shorted together; and
the negative side diode is formed by a second transistor having its base and collector being shorted together, or having its gate and drain being shorted together.

36. The switched capacitor circuit of claim 34, wherein:
the first positive side switch element is an n-type transistor;
the first negative side switch element is an n-type transistor,
the second switch element is a p-type transistor;
the second node is ground; and
the third node is a constant supply voltage.

37. The switched capacitor circuit of claim 34, wherein:
the first positive side switch element is a p-type transistor,
the first negative switch element is a p-type transistor;
the second switch element is an n-type transistor;
the second node is a constant supply voltage; and
the third node is ground.

38. The switched capacitor circuit of claim 32, further comprising a center switch element for selectively coupling the first positive side node to the first negative side node according to the control signal.

* * * * *